(12) United States Patent
Lee et al.

(10) Patent No.: US 12,364,134 B2
(45) Date of Patent: Jul. 15, 2025

(54) DISPLAY PANEL WITH IMPROVED DISPLAY QUALITY AND MANUFACTURING METHOD THEREOF

(71) Applicant: Samsung Display Co., Ltd., Yongin-si (KR)

(72) Inventors: Hyeseung Lee, Seoul (KR); Junghyun Kwon, Yongin-si (KR); Hyojoon Kim, Suwon-si (KR); Seon-Tae Yoon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 723 days.

(21) Appl. No.: 17/686,098

(22) Filed: Mar. 3, 2022

(65) Prior Publication Data

US 2022/0293685 A1 Sep. 15, 2022

(30) Foreign Application Priority Data

Mar. 9, 2021 (KR) ........................ 10-2021-0031037

(51) Int. Cl.
*H10K 59/38* (2023.01)
*H10K 59/80* (2023.01)
*H10K 71/00* (2023.01)

(52) U.S. Cl.
CPC ........... *H10K 59/38* (2023.02); *H10K 59/877* (2023.02); *H10K 71/00* (2023.02); *H10K 59/8792* (2023.02)

(58) Field of Classification Search
CPC .... H10K 59/38; H10K 71/00; H10K 59/8792; H10K 59/877; H10K 59/35

USPC .......................................................... 257/40
See application file for complete search history.

(56) References Cited

U.S. PATENT DOCUMENTS

| | | | |
|---|---|---|---|
| 10,126,587 B2 | 11/2018 | Chung | |
| 10,678,091 B2 | 6/2020 | Lee et al. | |
| 10,916,722 B2 | 2/2021 | Park et al. | |
| 2017/0076678 A1* | 3/2017 | Lee | ......... G02F 1/1336 |
| 2019/0025634 A1* | 1/2019 | Park | ......... G02F 1/133377 |
| 2019/0121176 A1* | 4/2019 | Lee | ......... G02F 1/133512 |
| 2019/0148458 A1 | 5/2019 | Kim | |
| 2019/0219875 A1* | 7/2019 | Jung | ......... G02F 1/133617 |
| 2019/0296088 A1* | 9/2019 | Kim | ......... H10K 59/877 |
| 2019/0310522 A1* | 10/2019 | Chu | ......... G02F 1/133617 |
| 2020/0266243 A1* | 8/2020 | Kim | ......... H10K 59/38 |

(Continued)

FOREIGN PATENT DOCUMENTS

| | | |
|---|---|---|
| EP | 3624199 A2 | 3/2020 |
| EP | 3690971 A1 | 8/2020 |
| KR | 10-2017-0034055 A | 3/2017 |

(Continued)

*Primary Examiner* — Nduka E Ojeh
(74) *Attorney, Agent, or Firm* — Womble Bond Dickinson (US) LLP

(57) ABSTRACT

A display panel may include first to third light emitting elements providing source light, first to third color filters, a first optical pattern between a first color filter and the first light emitting element, a second optical pattern between the second color filter and the second light emitting element, a third optical pattern between the third color filter and the third light emitting element, and a refractive layer between the first color filter and the first optical pattern, between the second color filter and the second optical pattern, and between the third optical pattern and the third light emitting element.

22 Claims, 16 Drawing Sheets

(56) References Cited

U.S. PATENT DOCUMENTS

2020/0326586 A1  10/2020  Kim et al.

FOREIGN PATENT DOCUMENTS

| KR | 10-2019-0047592 A | 5/2019 |
| KR | 10-2020-0032294 A | 3/2020 |
| KR | 10-2020-0100903 A | 8/2020 |
| KR | 10-2020-0120793 A | 10/2020 |
| KR | 10-2021-0005403 A | 1/2021 |

* cited by examiner

DISPLAY PANEL WITH IMPROVED DISPLAY QUALITY AND MANUFACTURING METHOD THEREOF

CROSS-REFERENCE TO RELATED APPLICATION

The present application claims priority to and the benefit of Korean Patent Application No. 10-2021-0031037, filed on Mar. 9, 2021, the entire contents of which is hereby incorporated by reference.

BACKGROUND

1. Field

Aspects of some embodiments of the present disclosure relate to a display panel with relatively improved display quality and a method of manufacturing the same.

2. Description of the Related Art

A display panel may include a transmissive display panel that may selectively transmit source light generated from a light source, and an emissive display panel that generates source light from the display panel itself. The display panel may include different types of light control patterns according to pixels to generate or display a color image. The light control pattern may transmit only a partial wavelength range of the source light or may change the color of the source light. Some of the light control patterns may change light characteristics without changing the color of the source light.

The above information disclosed in this Background section is only for enhancement of understanding of the background and therefore the information discussed in this Background section does not necessarily constitute prior art.

SUMMARY

Aspects of some embodiments of the present disclosure include a display panel with relatively improved light efficiency and image quality, and a method of manufacturing the same.

According to some embodiments of the inventive concept, in a display panel including a first pixel area, a second pixel area, a third pixel area, and a peripheral area adjacent to the first, second, and third pixel areas, the display panel includes: a first light emitting element, a second light emitting element, and a third light emitting element, the first, second, and third light emitting elements configured to generate source light and correspond to the first pixel area, the second pixel area, and the third pixel area, respectively; a first color filter, a second color filter, and a third color filter overlapping the first pixel area, the second pixel area, and the third pixel area, respectively; a first optical pattern between the first color filter and the first light emitting element configured to receive the source light and output a first color light; a second optical pattern between the second color filter and the second light emitting element configured to receive the source light and output a second color light; a third optical pattern between the third color filter and the third light emitting element configured to receive the source light and output a third color light; and a refractive layer between the first color filter and the first optical pattern, between the second color filter and the second optical pattern, and between the third optical pattern and the third light emitting element.

According to some embodiments, the display panel may further include a partition wall in which a first opening corresponding to the first pixel area and a second opening corresponding to the second pixel area are defined, wherein the first optical pattern may be inside the first opening, wherein the second optical pattern may be inside the second opening, and wherein the third optical pattern may include the same material as the partition wall and has an integral shape connected to the partition wall.

According to some embodiments, each of the partition wall and the third optical pattern may include a base resin and scattering particles mixed with the base resin.

According to some embodiments, the refractive layer may be between a first sidewall of the partition wall defining the first opening and the first optical pattern, and between a second sidewall of the partition wall defining the second opening and the second optical pattern.

According to some embodiments, a first surface of the first optical pattern facing the first light emitting element and a second surface of the second optical pattern facing the second light emitting element may have a curved shape, and wherein a third surface of the third optical pattern facing the third light emitting element may have a flatter shape than the first surface and the second surface.

According to some embodiments, the display panel may further include a division pattern in which a first pattern opening corresponding to the first pixel area, a second pattern opening corresponding to the second pixel area, and a third pattern opening corresponding to the third pixel area are defined, and wherein the division pattern may be spaced apart from the partition wall with the refractive layer interposed therebetween, and overlaps the peripheral area.

According to some embodiments, the display panel may further include a partition wall in which a first opening corresponding to the first pixel area, a second opening corresponding to the second pixel area, and a third opening corresponding to the third pixel area are defined, and wherein the first optical pattern may be inside the first opening, the second optical pattern may be inside the second opening, and the third optical pattern may be inside the third opening.

According to some embodiments, the third optical pattern may include a base resin and scattering particles mixed with the base resin, and wherein the partition wall may include a light absorbing material.

According to some embodiments, the refractive layer may be between a first sidewall of the partition wall defining the first opening and the first optical pattern, and between a second sidewall of the partition wall defining the second opening and the second optical pattern, and wherein the third optical pattern may be in direct contact with the partition wall.

According to some embodiments, the display panel may further include a division pattern in which a first pattern opening corresponding to the first pixel area, a second pattern opening corresponding to the second pixel area, and a third pattern opening corresponding to the third pixel area are defined, and wherein the division pattern may be spaced apart from the partition wall with the refractive layer interposed therebetween, and overlaps the peripheral area.

According to some embodiments, the first color filter may be a red color filter, the second color filter may be a green color filter, and the third color filter may be a blue color filter, and wherein the source light may be blue light, the first color light may be red light, the second color light may be green light, and the third color light may be blue light.

According to some embodiments, the third color filter may overlap the peripheral area and the third pixel area, the third color filter having openings defined to correspond to the first pixel area and the second pixel area, respectively, and wherein the first color filter may overlap the opening corresponding to the first pixel area, and the second color filter may overlap the opening corresponding to the second pixel area.

According to some embodiments, a refractive index of the refractive layer may be 1.23.

According to some embodiments, the display panel may further include a protective layer covering and contacting the refractive layer.

According to some embodiments of the inventive concept, in a display panel including a first pixel area, a second pixel area, a third pixel area, and a peripheral area adjacent to the first, second, and third pixel areas includes: a first light emitting element, a second light emitting element, and a third light emitting element, the first, second, and third light emitting elements configured to generate source light and correspond to the first pixel area, the second pixel area, and the third pixel area, respectively; a first color filter, a second color filter, and a third color filter overlapping the first pixel area, the second pixel area, and the third pixel area, respectively; a partition wall having a first opening corresponding to the first pixel area and a second opening corresponding to the second pixel area, and overlapping the peripheral area; a first optical pattern inside the first opening configured to receive the source light and outputting a first color light; a second optical pattern inside the second opening configured to receive the source light and outputting a second color light; and a refractive layer overlapping the first, second, and third pixel areas and the peripheral area, wherein the refractive layer is between the first color filter and the first optical pattern, between a first sidewall of the partition wall defining the first opening and the first optical pattern, between the second color filter and the second optical pattern, and between a second sidewall of the partition wall defining the second opening and the second optical pattern, and wherein in an area overlapping the third pixel area, the refractive layer is spaced apart from the third color filter.

According to some embodiments, the partition wall may include a base resin and scattering particles, wherein the partition wall may overlap the third pixel area, and wherein in an area overlapping the third pixel area, a portion of the refractive layer may be spaced apart from the third color filter with the partition wall interposed therebetween.

According to some embodiments, the display panel may further include a third optical pattern between the third color filter and the third light emitting element configured to receive the source light and output a third color light, and wherein a third opening corresponding to the third pixel area may be further defined in the partition wall, wherein the third optical pattern may be inside the third opening.

According to some embodiments, a portion of the refractive layer may be spaced apart from the third color filter with the third optical pattern interposed therebetween.

According to some embodiments, the third optical pattern may include a base resin and scattering particles mixed with the base resin, and wherein the partition wall may include a light absorbing material.

According to some embodiments of the inventive concept, a method of manufacturing a display panel including a first pixel area, a second pixel area, a third pixel area, and a peripheral area adjacent to the first, second, and third pixel areas includes: forming a first color filter, a second color filter, and a third color filter overlapping the first pixel area, the second pixel area, and the third pixel area, respectively; forming a partition wall having a first opening corresponding to the first pixel area and a second opening corresponding to the second pixel area, and overlapping the peripheral area and the third pixel area; forming a refractive layer covering the first color filter, the second color filter, and the partition wall; forming a first optical pattern inside the first opening after forming the refractive layer; and forming a second optical pattern inside the second opening after forming the refractive layer.

According to some embodiments, the forming of the partition wall may include a photolithography process, and wherein the partition wall may be formed by patterning a layer including a base resin and scattering particles mixed with the base resin through the photolithography process.

According to some embodiments, the method may further include: forming a third opening in a portion of the partition wall overlapping the third pixel area; and forming a third optical pattern including a base resin and scattering particles mixed with the base resin inside the third opening, wherein after forming the third optical pattern, the refractive layer is formed before forming the first optical pattern and the second optical pattern.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
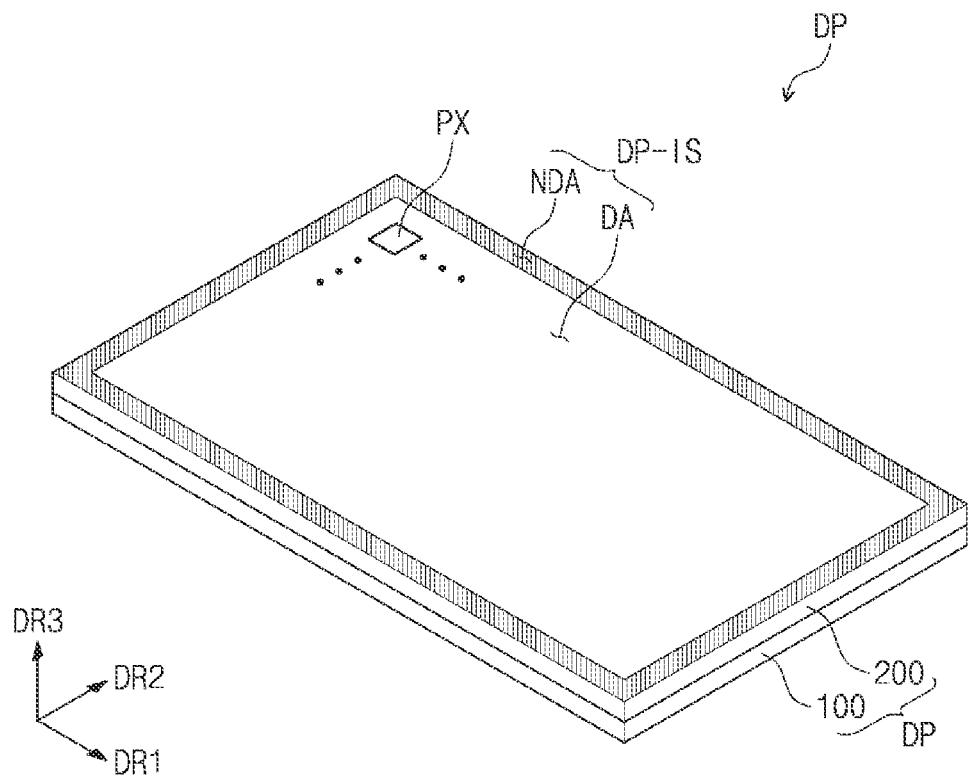
FIG. 1A is a perspective view of a display panel according to some embodiments of the inventive concept.

In this specification, when an element (or region, layer, part, etc.) is referred to as being "on", "connected to", or "coupled to" another element, it means that it may be directly placed on/connected to/coupled to other components, or a third component may be arranged between them.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing.

Unless otherwise defined, all terms (including technical and scientific terms) used herein have the same meaning as commonly understood by one of ordinary skill in the art to which this inventive concept belongs. In addition, terms defined in a commonly used dictionary should be interpreted as having a meaning consistent with the meaning in the context of the related technology, and unless interpreted in an ideal or overly formal sense, the terms are explicitly defined herein.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the inventive concept will be described with reference to the drawings.

Figure 1B:
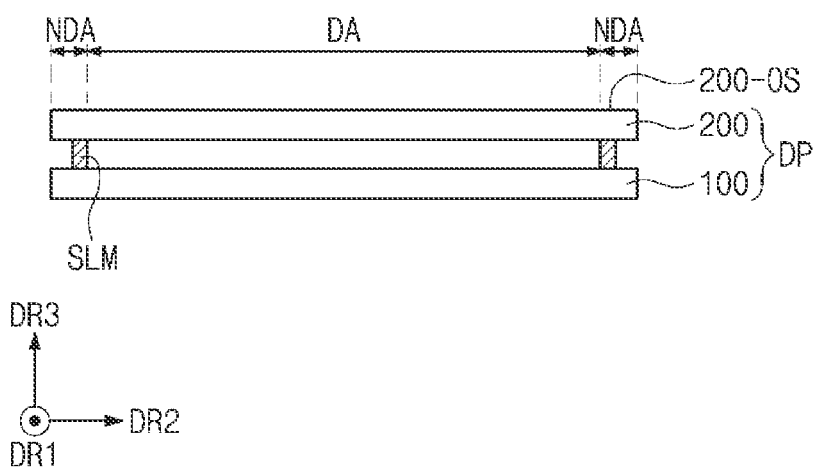
FIG. 1B is a cross-sectional view of a display panel according to some embodiments of the inventive concept.

FIG. 1A is a perspective view of a display panel according to some embodiments of the inventive concept. FIG. 1B is a cross-sectional view of a display panel according to some embodiments of the inventive concept.

Referring to FIGS. 1A and 1B, the display panel DP may be a component that generates or displays images. The display panel DP may be a light emitting display panel or a light receiving display panel. For example, the display panel DP may be any one of an organic light emitting display panel, a quantum dot light emitting display panel, a micro LED display panel, a nano LED display panel, a liquid crystal display panel, an electrophoretic display panel, an electrowetting display panel, and a MEMS display panel, but is not particularly limited.

The display panel DP may include a first substrate 100 (or a lower substrate) and a second substrate 200 (or an upper substrate) facing and spaced apart from the first substrate 100. A cell gap or space may be formed between the first substrate 100 and the second substrate 200. The cell gap may be maintained by a sealant SLM that couples the first substrate 100 and the second substrate 200. An insulating material may be filled in the cell gap, such that the first substrate 100 and the second substrate 200 are separated from each other with the insulating material therebetween.

A grayscale display layer configured to generate images may be located between the base substrate of the first substrate 100 and the base substrate of the second substrate 200. The grayscale display layer may include a liquid crystal layer, an organic emission layer, an inorganic emission layer (e.g., a quantum dot emission layer, an LED emission layer), or an electrophoretic layer according to the type of the display panel DP.

As shown in FIG. 1A, the display panel DP may display images at or through the display surface DP-IS. The outer surface 200-OS of the second substrate 200 shown in FIG. 1B may be defined as the display surface DP-IS of FIG. 1A.

The display surface DP-IS is parallel to a surface defined by the first direction DR1 and the second direction DR2. The display panel DP may include a display area DA and a non-display area NDA. The display panel DP may include a plurality of pixels PX located in the display area DA, and the pixels PX may not be located in the non-display area NDA. Although FIG. 1A illustrates a single pixel PX for ease of illustration, a person having ordinary skill in the art would appreciate that the display panel DP may include any suitable number of pixels PX according to the design of the display panel DP.

The non-display area NDA is defined along the edge of the display surface DP-IS. The non-display area NDA may surround the display area DA. That is, the non-display area NDA may be in a periphery (or outside a footprint) of the display area DA. According to some embodiments of the inventive concept, the non-display area NDA may be omitted or may be located only on one side of the display area DA.

The third direction DR3 indicates the normal direction of the display surface DP-IS, that is, the thickness direction of the display panel DP. The front surface (or upper surface) and the rear surface (or lower surface) of each of the layers or units described below may be divided by the third direction DR3.

According to some embodiments of the inventive concept, a display panel DP having a flat display surface DP-IS is illustrated, but embodiments according to the inventive concept are not limited thereto. The display panel DP may include a curved display surface or a three-dimensional display surface. The three-dimensional display surface may include a plurality of display areas indicating different directions.

Figure 2:
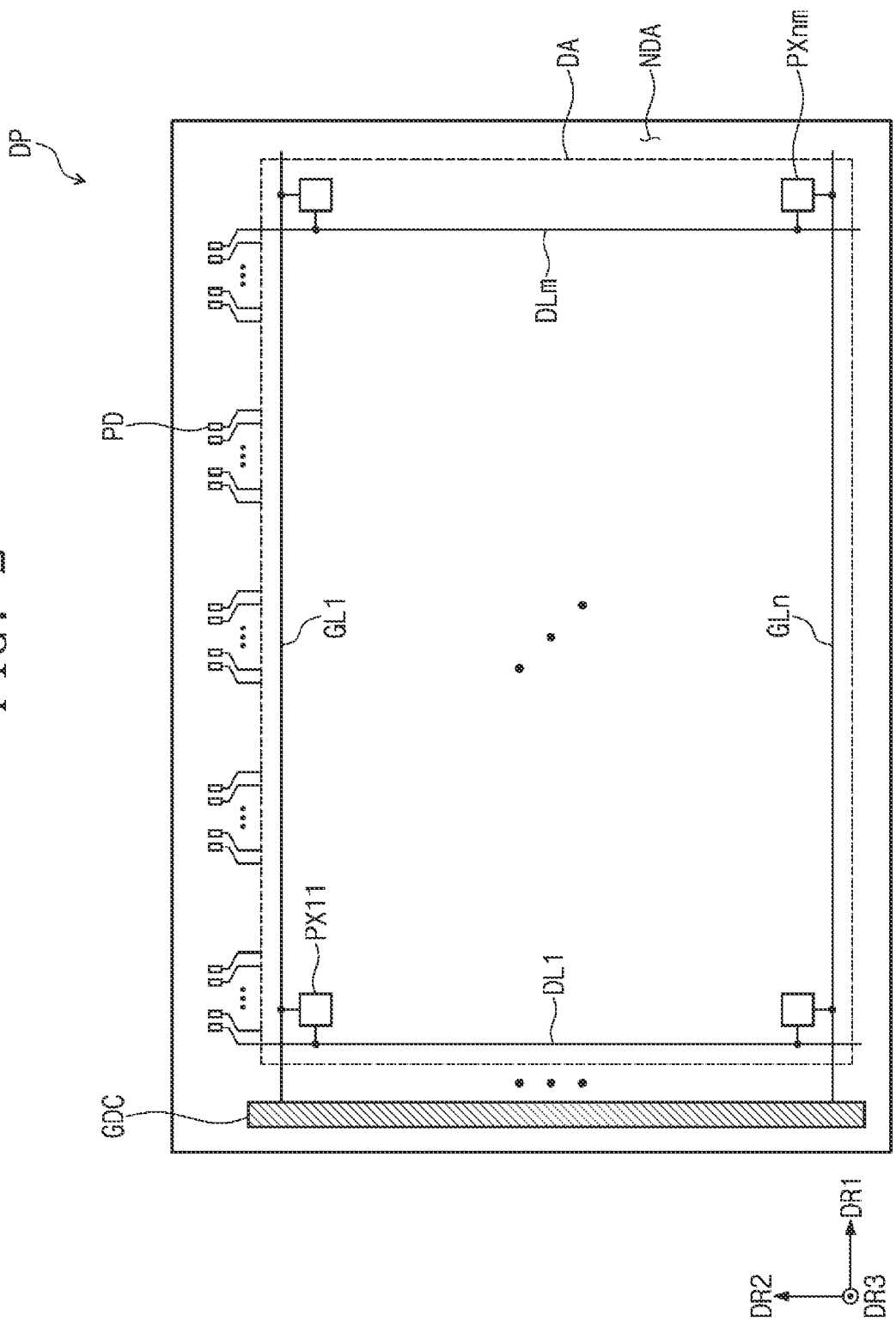
FIG. 2 is a plan view of a display panel according to some embodiments of the inventive concept.

FIG. 2 is a plan view of a display panel according to some embodiments of the inventive concept.

Referring to FIG. 2, a planar arrangement relationship between signal lines GL1 to GLn and DL1 to DLm and pixels PX11 to PXnm is illustrated, where n and m are whole numbers greater than 1. The signal lines GL1 to GLn and DL1 to DLm may include a plurality of gate lines GL1 to GLn and a plurality of data lines DL1 to DLm.

The display panel DP may include a display area DA and a non-display area NDA around the display area DA. The display area DA and the non-display area NDA may be distinguished by the presence or absence of the pixels PX11 to PXnm. The pixels PX11 to PXnm are located in the display area DA and may not be located in the non-display area NDA.

Each of the pixels PX11 to PXnm is connected to a corresponding gate line among the plurality of gate lines GL1 to GLn and a corresponding data line among the plurality of data lines DL1 to DLm. Each of the pixels PX11 to PXnm may include a pixel driving circuit and a display device. More types of signal lines may be provided on the display panel DP according to the configuration of the pixel driving circuit of the pixels PX11 to PXnm.

The scan driving circuit GDC and the pads PD may be located in the non-display area NDA. The scan driving circuit GDPC may be formed through the same process as the circuits in the display panel DP. The data driving circuit may be some circuit configured in the driving chip, and the driving chip may be electrically connected to the pixels PX11 to PXnm through the pads PD located in the non-display area NDA.

Figure 3A:
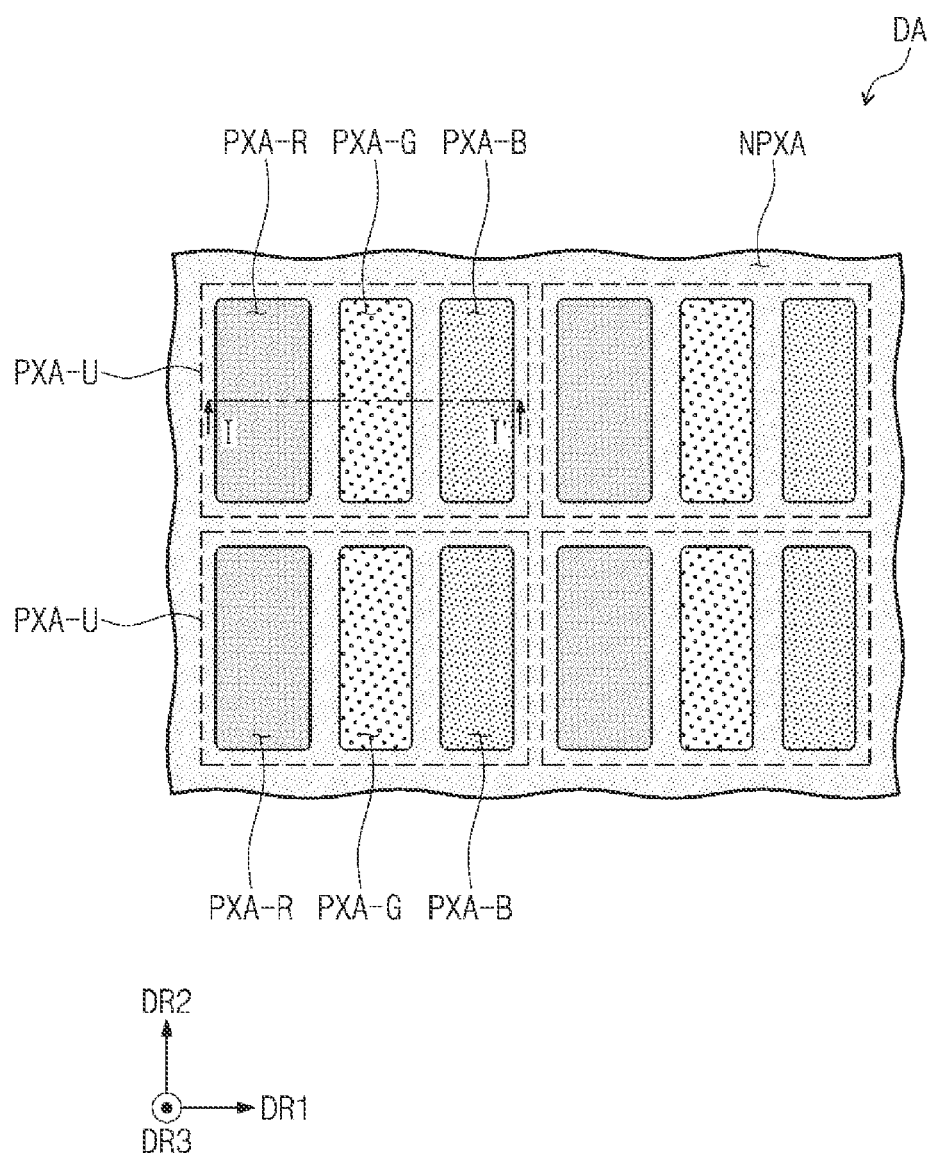
FIG. 3A is a plan view of a display area of a display panel according to some embodiments.

FIG. 3A is a plan view of a display area of a display panel according to some embodiments.

The plurality of pixel areas PXA-R, PXA-G, and PXA-B illustrated in FIG. 3A are illustrated as viewed from the outer surface 200-OS of the second substrate 200 illustrated in FIG. 1B. A peripheral area NPXA is defined adjacent to the plurality of pixel areas PXA-R, PXA-G, and PXA-B. The peripheral area NPXA may set a boundary between the first to third pixel areas PXA-R, PXA-G, and PXA-B, and prevent or reduce color mixing between the first to third pixel areas PXA-R, PXA-G, and PXA-B.

The first pixel area PXA-R, the second pixel area PXA-G, and the third pixel area PXA-B may provide different color light on the display surface DP-IS of FIG. 1A. On the display surface DP-IS, the first pixel area PXA-R may provide red light, the second pixel area PXA-G may provide green light, and the third pixel area PXA-B may provide blue light.

One first pixel area PXA-R, one second pixel area PXA-G, and one third pixel area PXA-B adjacent to each other may constitute one unit area PXA-U. The unit areas PXA-U may be arranged along the first direction DR1 and the second direction DR2.

Within one unit area PXA-U, the first pixel area PXA-R, the second pixel area PXA-G, and the third pixel area PXA-B may be arranged to be spaced apart in the first direction DR1.

Figure 3B:
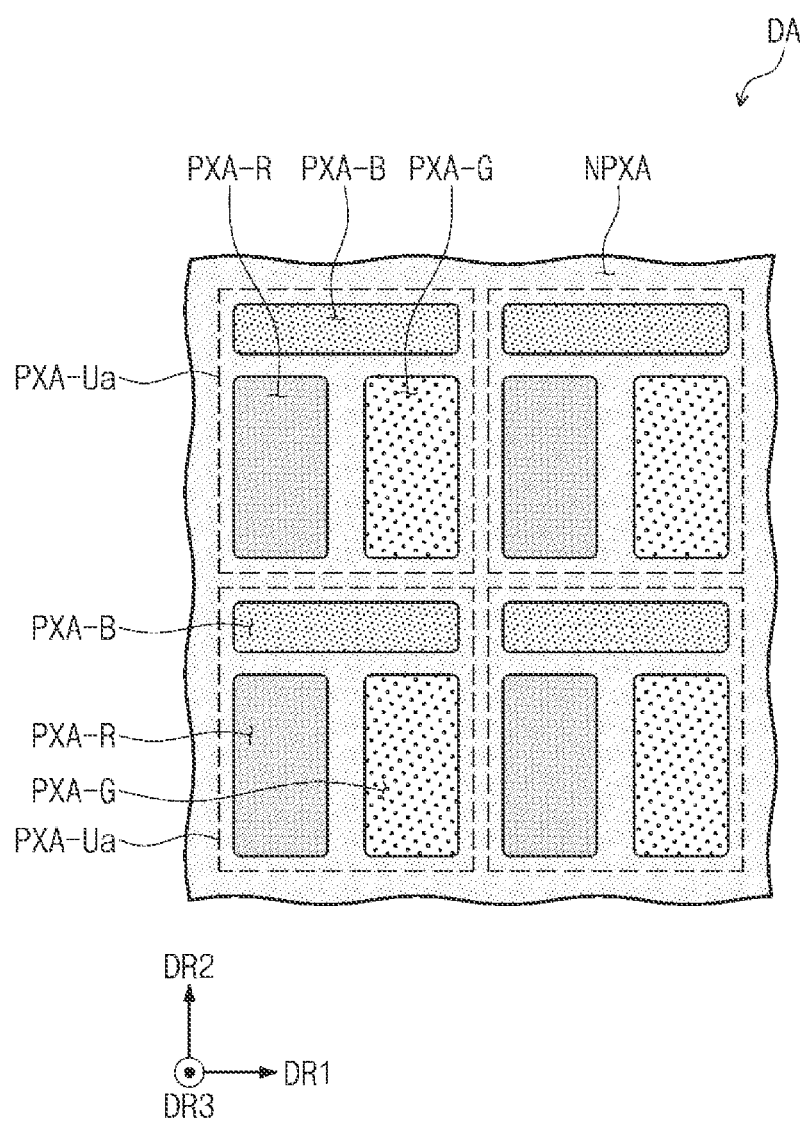
FIG. 3B is a plan view of a display area of a display panel according to some embodiments.

FIG. 3B is a plan view of a display area of a display panel according to some embodiments.

The plurality of pixel areas PXA-R, PXA-G, and PXA-B illustrated in FIG. 3B are illustrated as viewed from the outer surface 200-OS of the second substrate 200 illustrated in FIG. 1B.

One first pixel area PXA-R, one second pixel area PXA-G, and one third pixel area PXA-B adjacent to each other may constitute one unit area PXA-Ua. The unit areas PXA-Ua may be arranged along the first direction DR1 and the second direction DR2.

The first pixel area PXA-R and the second pixel area PXA-G are arranged to be spaced apart in the first direction DR1. The third pixel area PXA-B is arranged to be spaced apart from the first pixel area PXA-R and the second pixel area PXA-G in the second direction DR2. The width of the first direction DR1 of the third pixel area PXA-B may be greater than the width of the first direction DR1 of the first pixel area PXA-R and the width of the first direction DR1 of the second pixel area PXA-G.

Figure 3C:
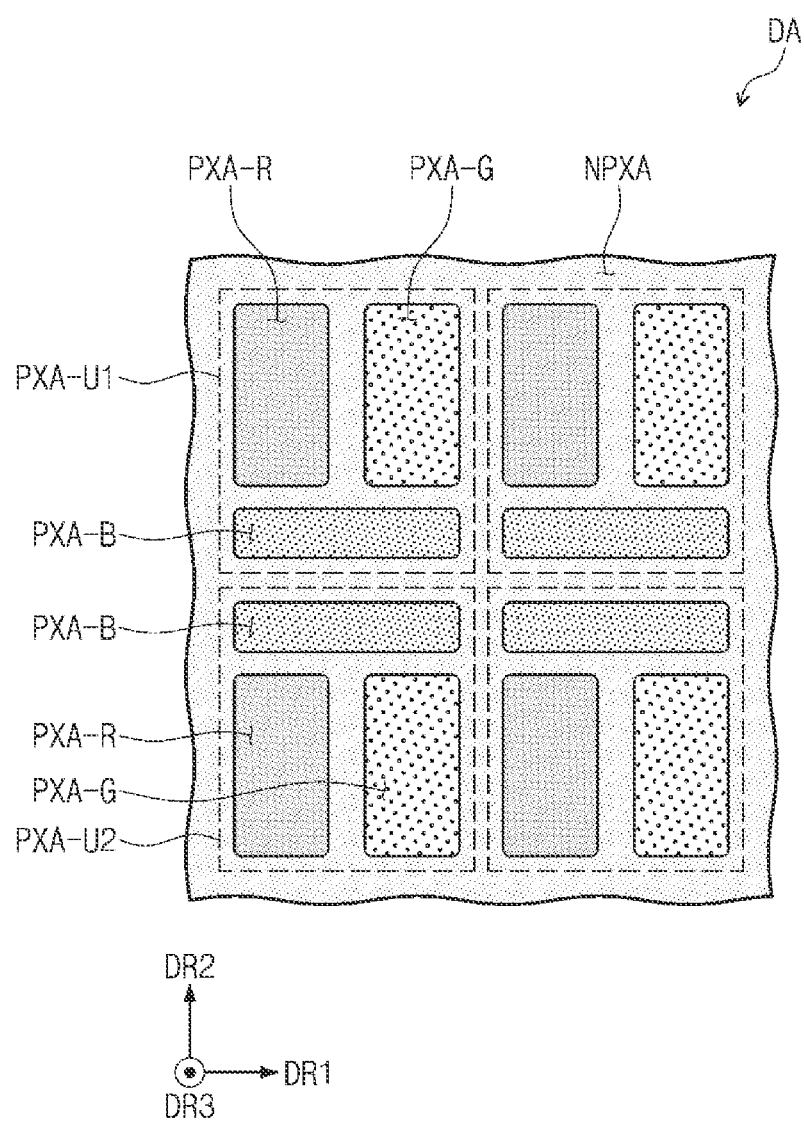
FIG. 3C is a plan view of a display area of a display panel according to some embodiments.

FIG. 3C is a plan view of a display area of a display panel according to some embodiments.

The plurality of pixel areas PXA-R, PXA-G, and PXA-B illustrated in FIG. 3C are illustrated as viewed from the outer surface 200-OS of the second substrate 200 illustrated in FIG. 1B.

One first pixel area PXA-R, one second pixel area PXA-G, and one third pixel area PXA-B adjacent to each other may constitute one first unit area PXA-U1 or another second unit area PXA-U2. The arrangement of the first to third pixel areas PXA-R, PXA-G, and PXA-B arranged in the second unit area PXA-U2 may have a symmetrical structure with the arrangement of the first to third pixel areas PXA-R, PXA-G, and PXA-B arranged in the first unit area PXA-U1.

The first unit areas PXA-U1 may be arranged to be spaced apart along the first direction DR1 to form one first unit row.

The second unit areas PXA-U2 may be arranged to be spaced apart along the first direction DR1 to form one second unit row. The first unit row and the second unit row may be alternately arranged one by one along the second direction DR2.

FIGS. 3A to 3C illustrate an example arrangement relationship between the first to third pixel areas PXA-R, PXA-G, and PXA-B, but the arrangement relationship is not particularly limited, and the arrangement of the pixel areas may have various patterns according to the design of the display panel DP.

Figure 4:
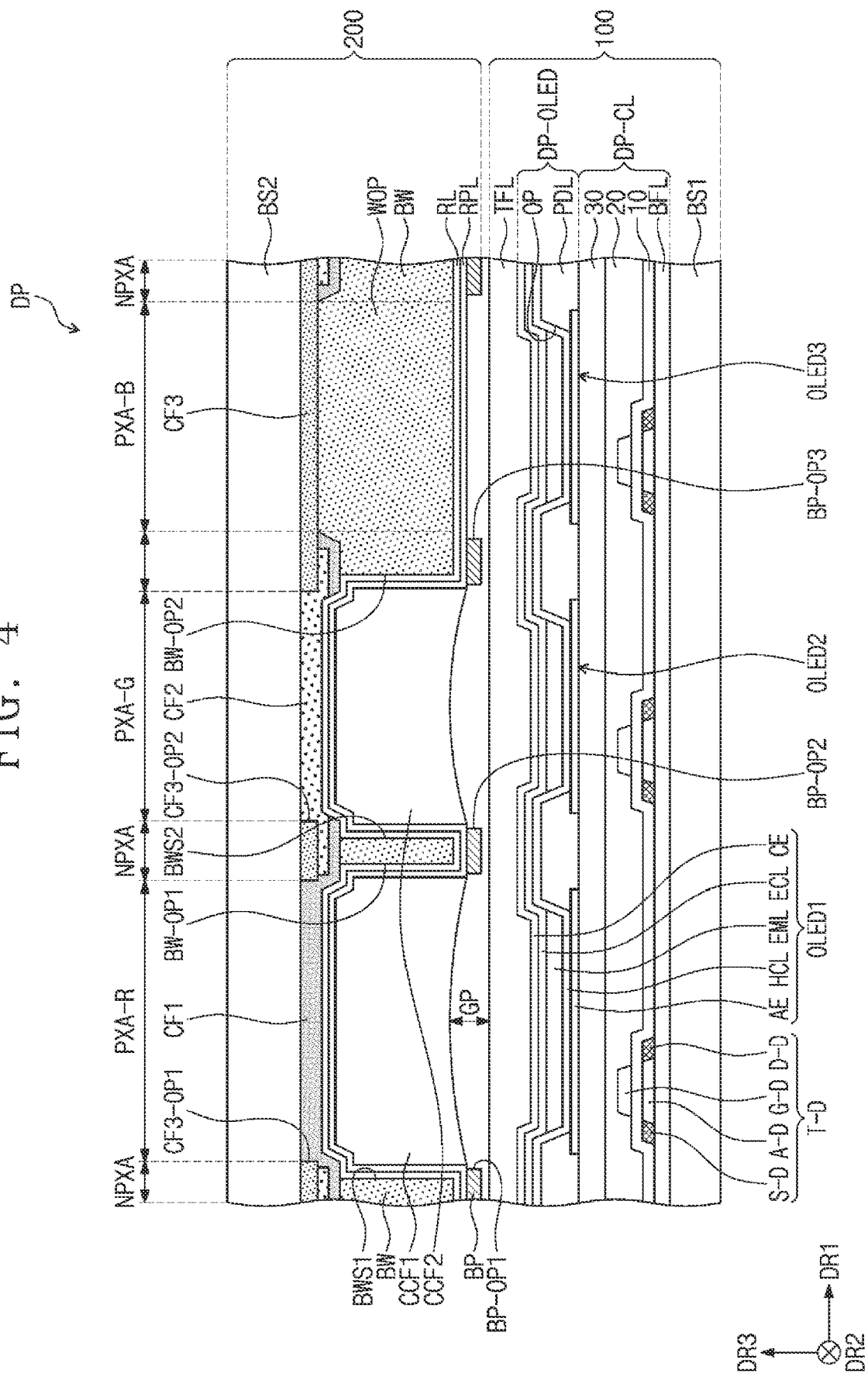
FIG. 4 is a cross-sectional view of a display panel according to some embodiments of the inventive concept corresponding to the line I-I' of FIG. 3A.

FIG. 4 is a cross-sectional view of a display panel according to some embodiments of the inventive concept corresponding to the line I-I' of FIG. 3A.

Referring to FIG. 4, the display panel DP may include a first substrate 100 and a second substrate 200. In FIG. 4, a case where the display panel DP is an organic light emitting display panel will be described as an example. The first substrate 100 and the second substrate 200 may form a gap (e.g., a set or predetermined gap) GP. According to some embodiments, the gap GP is described as an empty space, but according to some embodiments of the inventive concept, a material (e.g., a set or predetermined material) may fill the gap GP. For example, a suitable transparent insulating material may be deposited within the gap GP.

The first substrate 100 may include a first base substrate BS1, a circuit element layer DP-CL, a display element layer DP-OLED, and an upper insulating layer TFL. The stacked structure of the first substrate 100 is not particularly limited. The circuit element layer DP-CL may be located on the first base substrate BS1. The circuit element layer DP-CL may include a plurality of insulating layers, a plurality of conductive layers, and a semiconductor layer. The display element layer DP-OLED may be located on the circuit element layer DP-CL. The upper insulating layer TFL is located on the display element layer DP-OLED and may seal the display element layer DP-OLED.

The first base substrate BS1 may be a laminated structure including a silicon substrate, a plastic substrate, a glass substrate, an insulating film, or a plurality of insulating layers. According to some embodiments, the circuit element layer DP-CL may include a buffer layer BFL, a first insulating layer 10, a second insulating layer 20, and a third insulating layer 30.

The buffer layer BFL may be a barrier layer protecting the lower surfaces of the active region A-D, source region S-D, and drain region D-D. In this case, the buffer layer BFL may block contamination or moisture introduced through the first base substrate BS1 itself or the first base substrate BS1 from penetrating into the active region A-D, the source region S-D, and the drain region D-D. Alternatively, the buffer layer BFL may be a light blocking layer that blocks external light incident through the first base substrate BS1 from being incident to the actives A-D. In this case, the buffer layer BFL may further include a light blocking material.

FIG. 4 illustrates an example arrangement relationship between the active region A-D, the source region S-D, the drain region D-D, and the gate G-D constituting the driving transistor T-D. The active region A-D, the source region S-D, and the drain region D-D may be areas divided according to the doping concentration or conductivity of the semiconductor pattern.

The first insulating layer 10 is located on the buffer layer BFL and may cover the active region A-D, the source region S-D, and the drain region D-D. The first insulating layer 10 may include an inorganic material. According to some embodiments, the inorganic material may include at least one of silicon nitride, silicon oxy nitride, silicon oxide, titanium oxide, or aluminum oxide.

The gates G-D may be located on the first insulating layer 10. The second insulating layer 20 is located on the first insulating layer 10 and may cover the gate G-D. The second insulating layer 20 may include a single layer or may be formed from a plurality of layers. For example, the single layer may include an inorganic layer. The plurality of layers may include one or more organic layers and one or more inorganic layer.

The third insulating layer 30 may be located on the second insulating layer 20. The third insulating layer 30 may be formed of a single layer or may include a plurality of layers. For example, the single layer may include an organic layer. The plurality of layers may include one or more organic layers and one or more inorganic layers. The third insulating layer 30 may be a planarization layer providing a planar surface thereon.

The display element layer DP-OLED may be located on the third insulating layer 30. The display element layer DP-OLED may include first, second, and third light emitting elements OLED1, OLED2, and OLED3, and a pixel defining film PDL. According to some embodiments, the first, second, and third light emitting elements OLED1, OLED2, and OLED3 may be organic light emitting diodes, but are not limited thereto. For example, the first, second, and third light emitting elements OLED1, OLED2, and OLED3 may be a micro LED element or a nano LED element. The pixel defining film PDL may be an organic layer.

The first, second, and third light emitting elements OLED1, OLED2, and OLED3 may generate source light. Each of the first, second, and third light emitting elements OLED1, OLED2, and OLED3 may include a first electrode AE, a hole control layer HCL, an emission layer EML, an electron control layer ECL, and a second electrode CE.

The first electrode AE is located on the third insulating layer 30. The first electrode AE may be directly or indirectly connected to the driving transistor T-D, according to some embodiments. An emission opening part OP is defined in the pixel defining film PDL. The emission opening part OP exposes at least a portion of the first electrode AE. The emission opening part OP may define emission areas corresponding to the first pixel area PXA-R, the second pixel area PXA-G, and the third pixel area PXA-B on the first substrate 100. Here, "corresponding" is meant to refer to overlapping areas and is not limited to the same area or identical footprint.

The hole control layer HCL may be located on the first electrode AE. The hole control layer HCL may include a hole transport layer, and may further include a hole injection layer. The hole control layer HCL may be commonly arranged in the first to third pixel areas PXA-R, PXA-G, and PXA-B and the peripheral area NPXA.

The emission layer EML may be located on the hole control layer HCL. The emission layer EML may generate blue light as a source light. Blue light may include a wavelength of 410 nm to 480 nm. The emission spectrum of blue light may have a peak wavelength in the range of 440 nm to 460 nm. The emission layer EML may be independently arranged in the first to third pixel areas PXA-R, PXA-G, and PXA-B. "Independently arranged" means that the emission layer EML is separated for each of the first to third pixel areas PXA-R, PXA-G, and PXA-B. However, embodiments according to the inventive concept are not limited thereto, and the emission layer EML may be commonly arranged in the first to third pixel areas PXA-R, PXA-G, and PXA-B, and may be commonly arranged in the first to third pixel areas PXA-R, PXA-G, and PXA-B and the peripheral area NPXA.

The electron control layer ECL may be located on the emission layer EML. The electron control layer ECL may include an electron transport layer and may further include an electron injection layer. The electron control layer ECL may be commonly located in the first to third pixel areas PXA-R, PXA-G, and PXA-B and the peripheral area NPXA.

The second electrode CE may be located on the electron control layer ECL. The second electrode CE may be commonly arranged in the first to third pixel areas PXA-R, PXA-G, and PXA-B and the peripheral area NPXA.

The upper insulating layer TFL may be located on the second electrode CE. The upper insulating layer TFL may include an organic material or an inorganic material. The upper insulating layer TFL may have a multilayer structure in which an inorganic layer/organic layer is repeated. The upper insulating layer TFL may have a sealing structure of an inorganic layer/organic layer/inorganic layer.

The second substrate 200 may be located on the first substrate 100. The second substrate 200 may include a second base substrate BS2, a first color filter CF1, a second color filter CF2, a third color filter CF3, a first optical pattern CCF1, a second optical pattern CCF2, a partition wall BW, a third optical pattern WOP, a refractive layer RL, a protective layer RPL, and a division pattern BP.

The second base substrate BS2 may be a laminated structure including a silicon substrate, a plastic substrate, a glass substrate, an insulating film, or a plurality of insulating layers.

The first color filter CF1, the second color filter CF2, and the third color filter CF3 may overlap the first pixel area PXA-R, the second pixel area PXA-G, and the third pixel area PXA-B, respectively. The first color filter CF1, the second color filter CF2, and the third color filter CF3 transmit light in a specific wavelength range and block light outside the corresponding wavelength range. Each of the first color filter CF1, the second color filter CF2, and the third color filter CF3 includes a base resin and a dye and/or pigment dispersed in the base resin. The base resin is a medium in which dyes and/or pigments are dispersed or distributed, and may be made of various resin compositions that may be generally referred to as binders. The first color filter CF1 may be a color filter (or a red color filter) that transmits red light, the second color filter CF2 may be a color filter (or a green color filter) that transmits green light, and the third color filter CF3 may be a color filter (or a blue color filter) that transmits blue light.

A third color filter CF3 may be located on one surface of the second base substrate BS2. For example, the third color filter CF3 may be located on the lower surface of the second base substrate BS2. The third color filter CF3 may be located in the peripheral area NPXA and the third pixel area PXA-B. Openings CF3-OP1 and CF3-OP2 corresponding to the first pixel area PXA-R and the second pixel area PXA-G may be defined in the third color filter CF3.

The second color filter CF2 may be located in the opening CF3-OP2 corresponding to the second pixel area PXA-G. The first color filter CF1 may be located in the opening CF3-OP1 corresponding to the first pixel area PXA-R. Patterns including the same material as the first and second color filters CF1 and CF2 may be further located in the peripheral area NPXA.

The partition wall BW may be located under the first color filter CF1, the second color filter CF2, and the third color filter CF3. A first opening BW-OP1 corresponding to the first pixel area PXA-R and a second opening BW-OP2 corresponding to the second pixel area PXA-G may be defined in the partition wall BW. The first sidewall BWS1 of the partition wall BW may define a first opening BW-OP1, and the second sidewall BWS2 of the partition wall BW may define a second opening BW-OP2. A portion of the partition wall BW overlapping the third pixel area PXA-B may be defined as a third optical pattern WOP.

The partition wall BW and the third optical pattern WOP may include the same material, and may have an integral shape connected to each other. That is the third optical pattern WOP may be in contact with and/or conform to a contour of the shape of the partition wall BW. For example, the partition wall BW and the third optical pattern WOP may include a base resin and scattering particles mixed with the base resin. The scattering particles may be titanium oxide (TiO2) or silica-based nanoparticles. The refractive layer RL may be located under the partition wall BW, the first color filter CF1, and the second color filter CF2. A portion of the refractive layer RL in the third pixel area PXA-B may be spaced apart from the third color filter CF3 with the third optical pattern WOP therebetween. Therefore, the distance between the refractive layer RL and the second base substrate BS2 may be larger in the third pixel area PXA-B than in each of the first and second pixel areas PXA-R and PXA-G.

The refractive layer RL may be referred to as a low refractive layer. For example, the refractive layer RL may have a refractive index of 1.23. The refractive layer RL may refract or reflect light incident toward the partition wall BW.

Light directed to the partition wall BW by the refractive layer RL may be re-incident to the first optical pattern CCF1 or the second optical pattern CCF2, and accordingly, light emission efficiency of the display panel DP may be improved. Also, the partition wall BW includes the same material as the third optical pattern WOP. That is, the partition wall BW may include scattering particles. In this case, the light incident on the partition wall BW may be reflected or scattered by the scattering particles and re-incident to the first optical pattern CCF1 or the second optical pattern CCF2, and accordingly, light emission efficiency of the display panel DP may be improved.

The protective layer RPL may be located under the refractive layer RL. The protective layer RPL may be located under the refractive layer RL. The refractive layer RL may include silicon nitride.

The first optical pattern CCF1 may be located between the first color filter CF1 and the first light emitting element OLED1. The first optical pattern CCF1 may convert source light into first color light. The first optical pattern CCF1 may be located inside the first opening BW-OP1.

The second optical pattern CCF2 may be located between the second color filter CF2 and the second light emitting element OLED2. The second optical pattern CCF2 may convert source light into second color light. The second optical pattern CCF2 may be located inside the second opening BW-OP2.

The first optical pattern CCF1 may receive source light and may output first color light, and the second optical pattern CCF2 may receive source light and may output second color light. For example, the first optical pattern CCF1 and the second optical pattern CCF2 may change optical properties of the source light. For example, after the first optical pattern CCF1 absorbs the source light, it may generate first color light of a color different from that of the source light, and after the second optical pattern CCF2 absorbs the source light, it may generate second color light having a color different from that of the source light. The first optical pattern CCF1 may be referred to as a first light conversion pattern, and the second optical pattern CCF2 may be referred to as a second light conversion pattern.

The third optical pattern WOP may receive source light and output third color light. Each of the source light and the third color light may be blue light. The first color light may be red light, and the second color light may be green light.

Each of the first optical pattern CCF1 and the second optical pattern CCF2 may include a base resin and quantum dots mixed (or dispersed) in the base resin. According to some embodiments, the optical pattern may be defined as a quantum dot pattern, and includes different quantum dots. The base resin is a medium in which quantum dots are dispersed, and may be made of various resin compositions that may be generally referred to as binders. However, the present disclosure is not limited thereto, and in the present specification, any medium capable of dispersing quantum dots may be referred to as a base resin regardless of its name, additional other functions, and constituent materials. The base resin may be a polymer resin. For example, the base resin may be an acrylic resin, a urethane resin, a silicone resin, an epoxy resin, or the like. The base resin may be a transparent resin.

Each of the first optical pattern CCF1 and the second optical pattern CCF2 may further include scattering particles mixed with the base resin. The scattering particles may be titanium oxide ($TiO_2$) or silica-based nanoparticles.

Quantum dots may be particles that convert the wavelength of incident light. Quantum dots are materials with a crystal structure of several nanometers, composed of hundreds to thousands of atoms, and exhibit a quantum confinement effect that increases the energy band gap due to their small size. When light with a wavelength higher than the band gap is incident on the quantum dots, quantum dots absorb the light, become excited, and fall to the ground state while emitting light of a specific wavelength. The energy of the emitted light has a value corresponding to the band gap. By controlling the size and composition of the quantum dots, it is possible to control the light emission characteristics due to the quantum confinement effect.

The quantum dots may be selected from a group II-VI compound, a group I-III-VI compound, a group III-V compound, a group IV-VI compound, a group IV element, a group IV compound, and combinations thereof.

The group II-VI compound may be selected from the group consisting of a two-element compound selected from the group consisting of CdSe, CdTe, CdS, ZnS, ZnSe, ZnTe, ZnO, HgS, HgSe, HgTe, MgSe, MgS, and mixtures thereof, a three-element compound selected from the group consisting of AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, and a four-element compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The I-III-VI group compound may be selected from a three-element compound selected from the group consisting of $AgInS_2$, $CuInS_2$, $AgGaS_2$, $CuGaS_2$, and mixtures thereof, or a four-element compound such as $AgInGaS_2$ and $CuInGaS_2$.

The group III-V compound may be selected from the group consisting of a two-element compound selected from the group consisting of GaN, GaP, GaAs, GaSb, AlN, AlP, AlAs, AlSb, InN, InP, InAs, InSb, and mixtures thereof, a three-element compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a four-element compound selected from the group consisting of GaAlNP, GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, and mixtures thereof. Meanwhile, the Group III-V compound may further include a Group II metal. For example, InZnP or the like may be selected as the group III-II-V compound.

The group IV-VI compound may be selected from the group consisting of a two-element compound selected from the group consisting of SnS, SnSe, SnTe, PbS, PbSe, PbTe, and mixtures thereof, aa three-element compound selected from the group consisting of SnSeS, SnSeTe, SnSTe, PbSeS, PbSeTe, PbSTe, SnPbS, SnPbSe, SnPbTe, and mixtures thereof, and a four-element compound selected from the group consisting of SnPbSSe, SnPbSeTe, SnPbSTe, and mixtures thereof. The group IV element may be selected from the group consisting of Si, Ge, and mixtures thereof. The group IV compound may be a two-element compound selected from the group consisting of SiC, SiGe, and mixtures thereof.

At this time, the two-element compound, the three-element compound, or the four-element compound may be present in the particle at a uniform concentration, or may be present in the same particle by partially dividing the concentration distribution into different states.

The quantum dots may have a core-shell structure including a core and a shell surrounding the core. In addition, one quantum dot may have a core/shell structure surrounding another quantum dot. The interface between the core and the shell may have a concentration gradient in which the concentration of elements present in the shell decreases toward the core.

The quantum dots may be particles having a size of a nanometer scale. Quantum dots may have a full width at half maximum (FWHM) of the emission wavelength spectrum of about 45 nm or less, about 40 nm or less according to some embodiments, about 30 nm or less according to some embodiments, and may improve color purity or color reproducibility in this range. In addition, because light emitted through these quantum dots is emitted in all directions, a wide viewing angle may be improved.

In addition, the shape of the quantum dots is a type generally used in the field and is not particularly limited, and more specifically, may be a spherical form, a pyramidal form, a multi-arm form, or a form of cubic nanoparticles, nanotubes, nanowires, nanofibers, and nanoplatelet particles. The quantum dots may control the color of light emitted according to the particle size, and accordingly, the quantum dots may have various emission colors such as red light, green light, and blue light.

According to some embodiments, the first optical pattern CCF1 located in the first pixel area PXA-R may be a red quantum dot pattern that generates red light after absorbing source light. The second optical pattern CCF2 located in the second pixel area PXA-G may be a green quantum dot pattern that generates green light after absorbing source light.

The refractive layer RL may be located between the first optical pattern CCF1 and the first sidewall BWS1 of the partition wall BW and between the second optical pattern CCF2 and the second sidewall BWS2 of the partition wall BW. The refractive layer RL refracts or reflects light directed to the partition wall BW, and accordingly, light emission efficiency may be improved.

The refractive layer RL may be located between the first color filter CF1 and the first optical pattern CCF1, between the second color filter CF2 and the second optical pattern CCF2, and between the third optical pattern WOP and the third light emitting element OLED3. That is, the refractive layer RL may not be located between the third color filter CF3 and the third optical pattern WOP.

Even if the refractive layer RL is located between the first color filter CF1 and the first optical pattern CCF1 and between the second color filter CF2 and the second optical pattern CCF2, the light incident on the quantum dot is emitted in all directions, such that the reduction in the luminance ratio of the front side may be insignificant.

Unlike some embodiments according to the present disclosure, when the refractive layer RL is located between the third color filter CF3 and the third optical pattern WOP, the luminance ratio of the front side in the third pixel area PXA-B may be reduced. However, according to some embodiments of the inventive concept, in the third pixel area PXA-B in which the third optical pattern WOP not including quantum dots is located, the refractive layer RL may not be located between the third color filter CF3 and the third optical pattern WOP. Accordingly, the degree to which the luminance ratio of the front side of the third pixel area PXA-B is decreased may be less than that of the comparative example.

As the refractive layer RL in contact with the sidewall of the partition wall BW is added, light emission efficiency may be improved. In addition, the position of the refractive layer RL in the third pixel area PXA-B is arranged differently from the position of the refractive layer RL in the first and second pixel areas PXA-R and PXA-G so that the degree of reduction in the luminance ratio of the front side in the third pixel area PXA-B may be reduced. As a result, white angle difference (WAD) characteristics of the display panel DP may be improved. WAD is an item to evaluate the change in white characteristics according to the observation angle. For example, WAD characteristics may be evaluated by measuring the luminance change amount and the color coordinate change amount according to the observed angle compared to the front observed in a direction perpendicular to the screen, for example, the third direction DR3. When the WAD characteristic is improved, the display quality of the display device DP may be improved.

The division pattern BP may be located under the partition wall BW. The division pattern BP may be spaced apart from the partition wall BW with the refractive layer RL and the protective layer RPL therebetween. In the division pattern BP, a first pattern opening BP-OP1 corresponding to the first pixel area PXA-R may be defined, a second pattern opening BP-OP2 corresponding to the second pixel area PXA-G may be defined, and a third pattern opening BP-OP3 corresponding to the third pixel area PXA-B may be defined.

The division pattern BP may include a black component. For example, the black component may include a black dye, a black pigment, or carbon black, or may include a metal such as chromium or an oxide thereof, but is not particularly limited thereto.

According to some embodiments of the inventive concept, a refractive layer RL is located between the third optical pattern WOP and the third light emitting element OLED3. For example, among the lights incident on the refractive layer RL, light having an incident angle of at least an angle (e.g., a set or predetermined angle) may be reflected by the refractive layer RL. For example, the angle (e.g., the set or predetermined angle) may be an angle that causes color mixing. For example, when light emitted from the first light emitting element OLED1 or the second light emitting element OLED2 other than the third light emitting element OLED3 is directed to the third optical pattern WOP through the third pattern opening BP-OP3, the light may be reflected from the refractive layer RL. As a result, the color matching rate may increase due to a decrease in color mixture in the third pixel area PXA-B.

FIGS. 5A to 5D are views illustrating a method of manufacturing a second substrate according to some embodiments of the inventive concept.

Figure 5A:
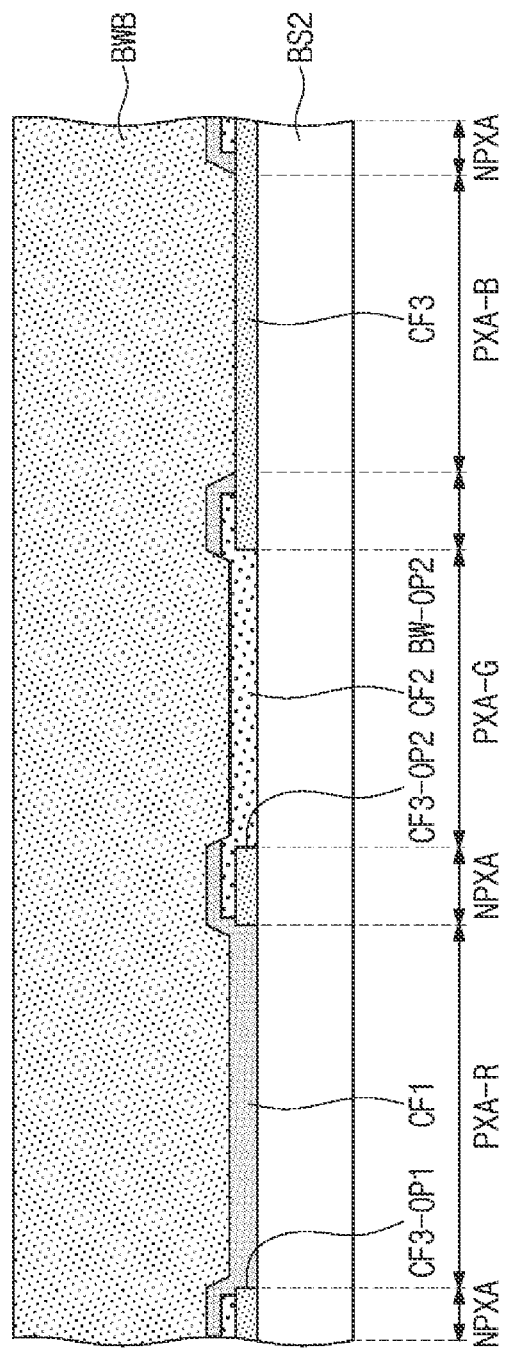
FIGS. 5A to 5D are views illustrating a method of manufacturing a second substrate according to some embodiments of the inventive concept.

Referring to FIG. 5A, a first color filter CF1, a second color filter CF2, and a third color filter CF3 may be formed on one surface of the second base substrate BS2. Thereafter, a partition wall layer BWB covering the first to third color filters CF1, CF2, and CF3 is formed. The partition wall layer BWB may include a base resin and scattering particles.

Figure 5B:
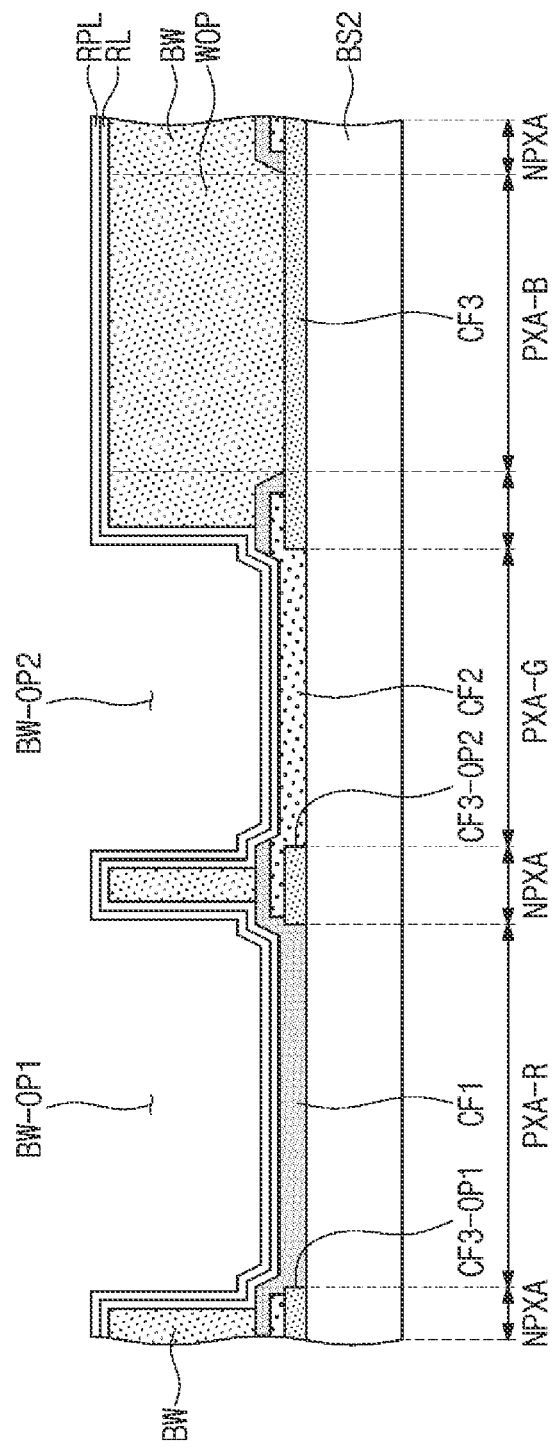

Referring to FIGS. 5A and 5B, a partition wall BW is formed by patterning the partition wall layer BWB. For example, forming the partition wall BW may include a photolithography process.

A first opening BW-OP1 overlapping the first pixel area PXA-R and a second opening BW-OP2 overlapping the second pixel area PXA-G may be defined in the partition wall BW. A portion of the partition wall BW corresponding to the third pixel area PXA-B may be referred to as a third optical pattern WOP.

Thereafter, a refractive layer RL covering the first color filter CF1, the second color filter CF2, the third optical pattern WOP, and the partition wall BW is formed. After that, a protective layer RPL that covers the refractive layer RL and protects the refractive layer RL is formed.

Figure 5C:
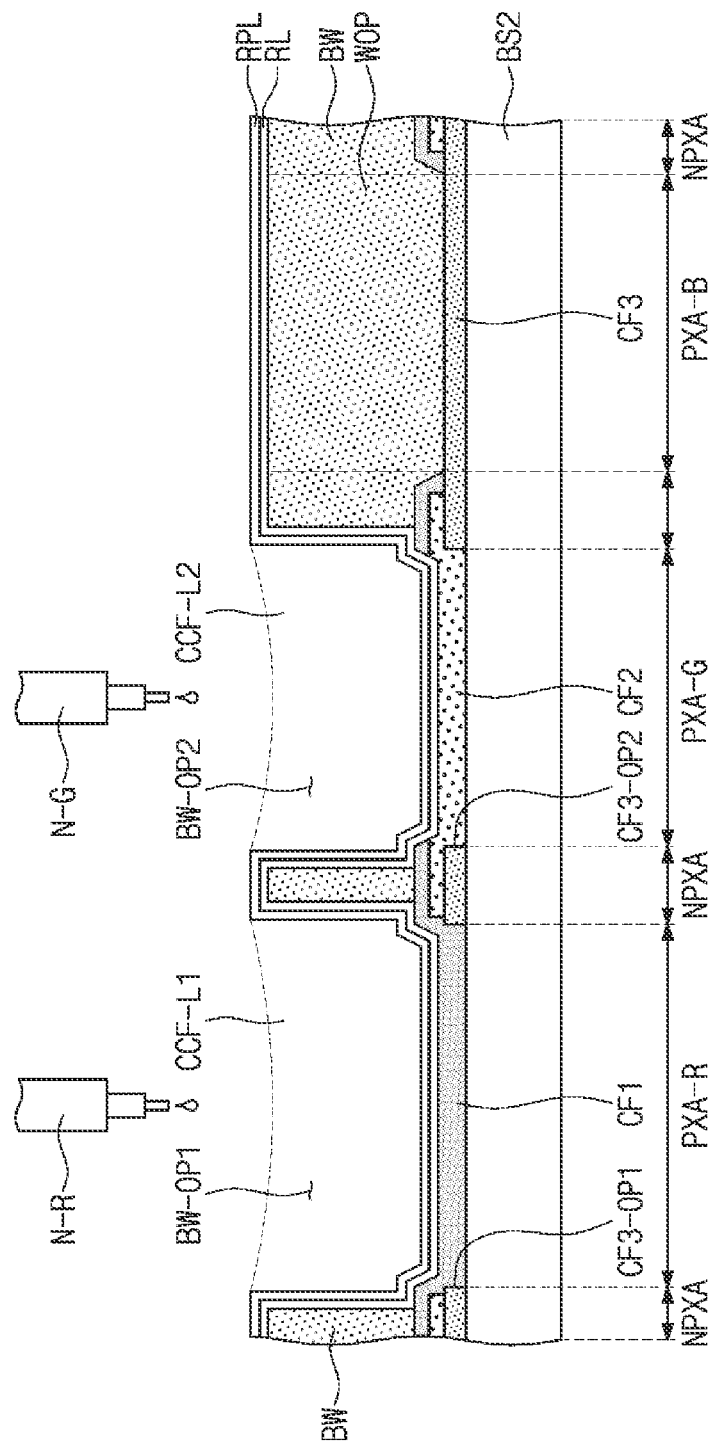

Referring to FIG. 5C, after forming a refractive layer RL and a protective layer RPL, a first composition CCF-L1 and a second composition CCF-L2 may be provided using an inkjet process. The inkjet head may include a nozzle N-R providing a first composition CCF-L1 and a nozzle N-G providing a second composition CCF-L2. While moving in a direction (e.g., a set or predetermined direction), the inkjet head may provide the first composition CCF-L1 to the first opening BW-OP1, and provide the second composition CCF-L2 to the second opening BW-OP2.

Figure 5D:
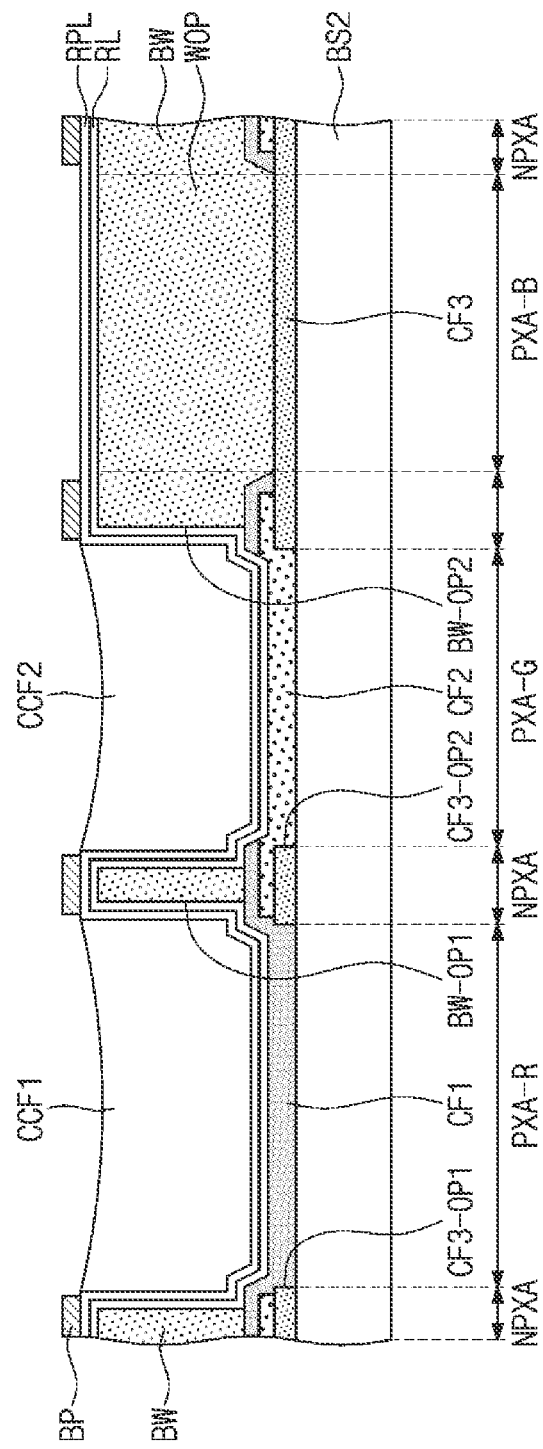

Referring to FIGS. 5C and 5D, the first composition CCF-L1 and the second composition CCF-L2 are dried. As a result, the first optical pattern CCF1 and the second optical pattern CCF2 may be formed.

The upper surface (or the first surface) of the first optical pattern CCF1 and the upper surface (or the second surface) of the second optical pattern CCF2 may have a concave shape, and the upper surface (or the third surface) of the third optical pattern WOP may have a relatively flat shape. Because the third optical pattern WOP is formed by a photolithography process, it may have a flat upper surface, and because the first optical pattern CCF1 and the second optical pattern CCF2 undergo a drying process after providing a liquid composition, they may have a relatively curved upper surface. The upper surface of each of the first optical pattern CCF1 and the second optical pattern CCF2 and the upper surface of the third optical pattern WOP may mean a surface facing the first substrate 100 (refer to FIG. 4).

After that, as overlapping the peripheral area NPXA, a division pattern BP having an opening corresponding one-to-one to each of the first to third pixel areas PXA-R, PXA-G, and PXA-B may be formed.

Figure 6:
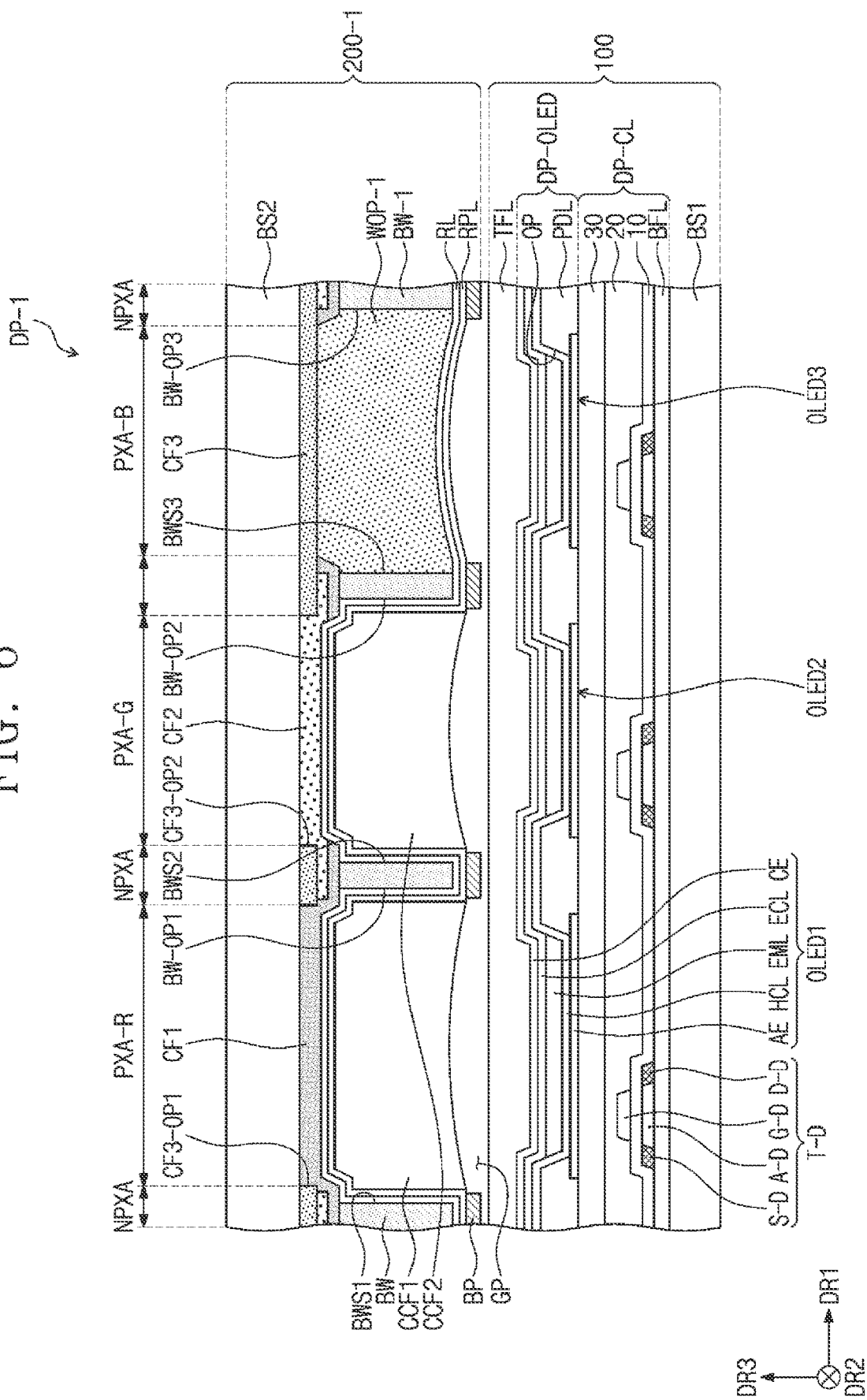
FIG. 6 is a cross-sectional view of a display panel according to some embodiments of the inventive concept corresponding to the line I-I' of FIG. 3A.

FIG. 6 is a cross-sectional view of a display panel according to some embodiments of the inventive concept corresponding to the line I-I' of FIG. 3A. In describing FIG. 6, a portion that is different from FIG. 4 will be mainly described, and substantially the same components are denoted by the same reference numerals as in FIG. 4, and some repetitive descriptions thereof may be omitted.

Referring to FIG. 6, the display panel DP-1 may include a first substrate 100 and a second substrate 200-1.

The second substrate 200-1 may be located on the first substrate 100. The second substrate 200-1 may include a second base substrate BS2, a first color filter CF1, a second color filter CF2, a third color filter CF3, a first optical pattern CCF1, and a second optical pattern CCF2, a partition wall BW-1, a third optical pattern WOP-1, a refractive layer RL, a protective layer RPL, and a division pattern BP.

The partition wall BW-1 may be located under the first color filter CF1, the second color filter CF2, and the third color filter CF3. In the partition wall BW-1, the first opening BW-OP1 corresponding to the first pixel area PXA-R, the second opening BW-OP2 corresponding to the second pixel area PXA-G, and the third opening BW-OP3 corresponding to the third pixel area PXA-B may be defined. The first sidewall BWS1 of the partition wall BW-1 may define a first opening BW-OP1, the second sidewall BWS2 of the partition wall BW-1 may define a second opening BW-OP2, and the third sidewall BWS3 of the partition wall BW-1 may define a third opening BW-OP3.

The partition wall BW-1 may include a black component. For example, the black component may include a black dye, a black pigment, or carbon black, or may include a metal such as chromium or an oxide thereof, but is not particularly limited thereto.

The third optical pattern WOP-1 may be located inside the third opening BW-OP3 of the partition wall BW-1. The third optical pattern WOP-1 may include a base resin and scattering particles mixed with the base resin. The scattering particles may be titanium oxide (TiO2) or silica-based nanoparticles.

The refractive layer RL may be located under the partition wall BW-1, the first color filter CF1, the second color filter CF2, and the third optical pattern WOP-1. A portion of the refractive layer RL in the third pixel area PXA-B may be spaced apart from the third color filter CF3 with the third optical pattern WOP-1 therebetween.

The refractive layer RL may be located between the first optical pattern CCF1 and the first sidewall BWS1 of the partition wall BW-1 and between the second optical pattern CCF2 and the second sidewall BWS2 of the partition wall BW-1. The refractive layer RL may not be located between the third optical pattern WOP-1 and the partition wall BW-1. Accordingly, the third optical pattern WOP-1 may directly contact the partition wall BW-1.

Light directed to the partition wall BW-1 by the refractive layer RL may be re-incident to the first optical pattern CCF1 or the second optical pattern CCF2, and accordingly, light emission efficiency of the display panel DP-1 may be improved.

The refractive layer RL may be located between the first color filter CF1 and the first optical pattern CCF1, between the second color filter CF2 and the second optical pattern CCF2, and between the third optical pattern WOP-1 and the third light emitting element OLED3. That is, the refractive layer RL may not be located between the third color filter CF3 and the third optical pattern WOP-1.

Even if the refractive layer RL is located between the first color filter CF1 and the first optical pattern CCF1 and between the second color filter CF2 and the second optical pattern CCF2, the light incident on the quantum dot is emitted in all directions, such that the reduction in the luminance ratio of the front side may be insignificant. According to some embodiments of the inventive concept, in the third pixel area PXA-B in which the third optical pattern WOP-1 not including quantum dots is located, the refractive layer RL may not be located between the third color filter CF3 and the third optical pattern WOP-1.

As the refractive layer RL in contact with the sidewall of the partition wall BW-1 is added, light emission efficiency may be improved. In addition, the position of the refractive layer RL in the third pixel area PXA-B is arranged differently from the position of the refractive layer RL in the first and second pixel areas PXA-R and PXA-G so that the degree of reduction in the luminance ratio of the front side in the third pixel area PXA-B may be reduced. As a result, while improving light emission efficiency, the display panel DP-1 with improved WAD characteristics may be provided.

FIGS. 7A to 7E are views illustrating a method of manufacturing a second substrate according to some embodiments of the inventive concept.

Figure 7A:
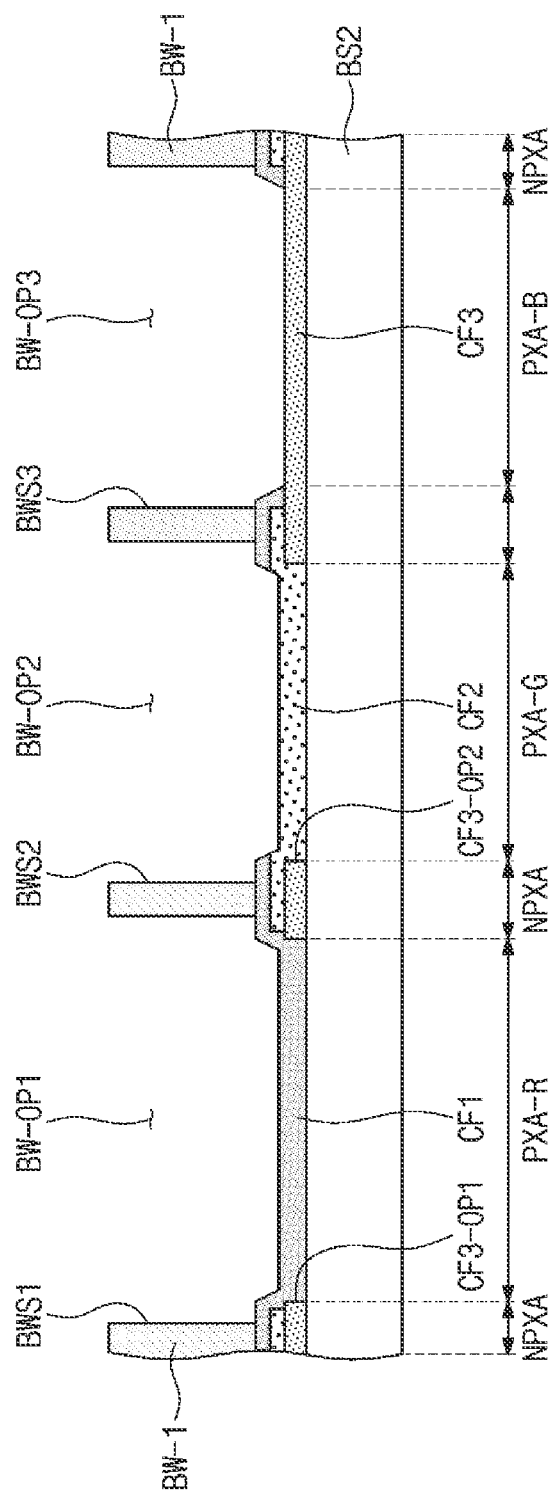
FIGS. 7A to 7E are views illustrating a method of manufacturing a second substrate according to some embodiments of the inventive concept.

Referring to FIG. 7A, a first color filter CF1, a second color filter CF2, and a third color filter CF3 are formed on one surface of the second base substrate BS2. Thereafter, the partition wall BW-1 in which the first to third openings BW-OP1, BW-OP2, and BW-OP3 are defined is formed. The first to third openings BW-OP1, BW-OP2, and BW-OP3 may be defined in a one-to-one correspondence with each of the first to third pixel areas PXA-R, PXA-G, and PXA-B.

The partition wall BW-1 may be formed by a photolithography process. The partition wall BW-1 may include a black component. For example, the black component may include a black dye, a black pigment, or carbon black, or may include a metal such as chromium or an oxide thereof, but embodiments according to the present disclosure are not particularly limited thereto.

Figure 7B:
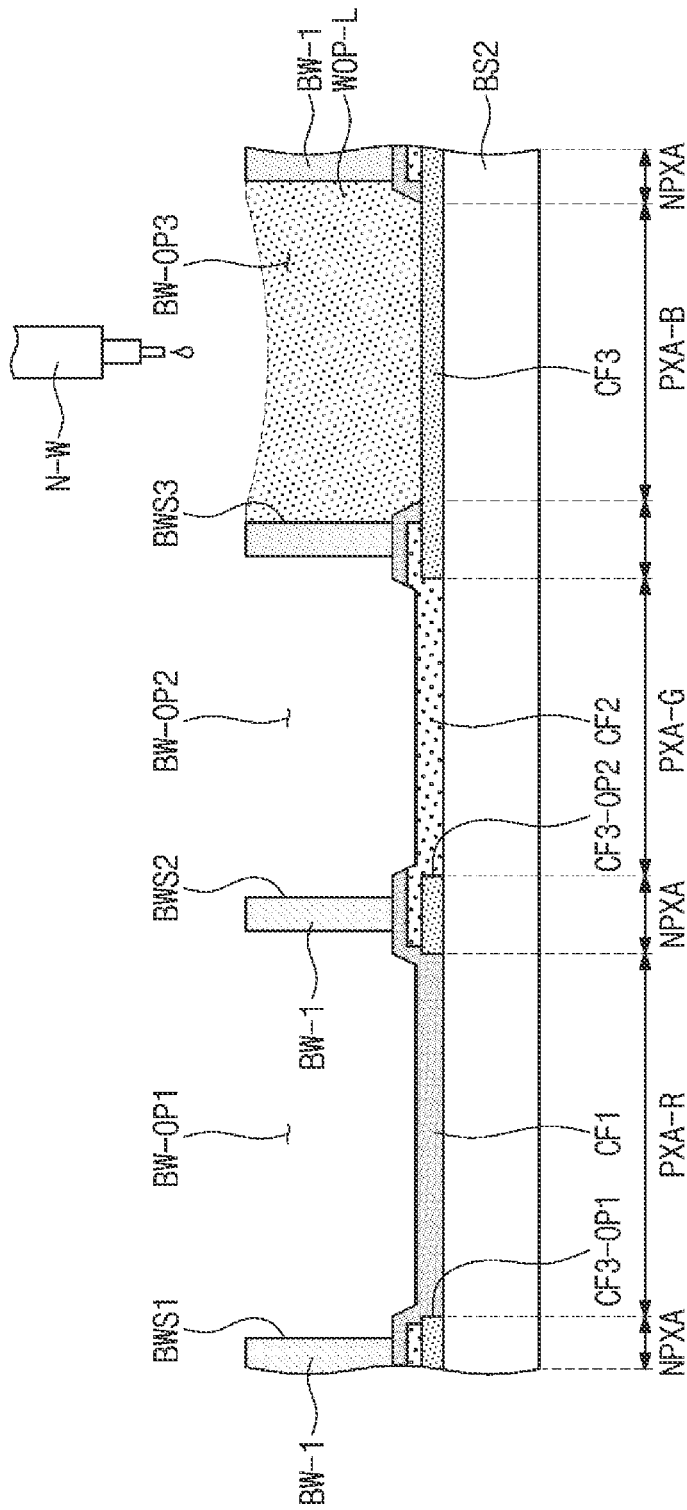
Figure 7C:
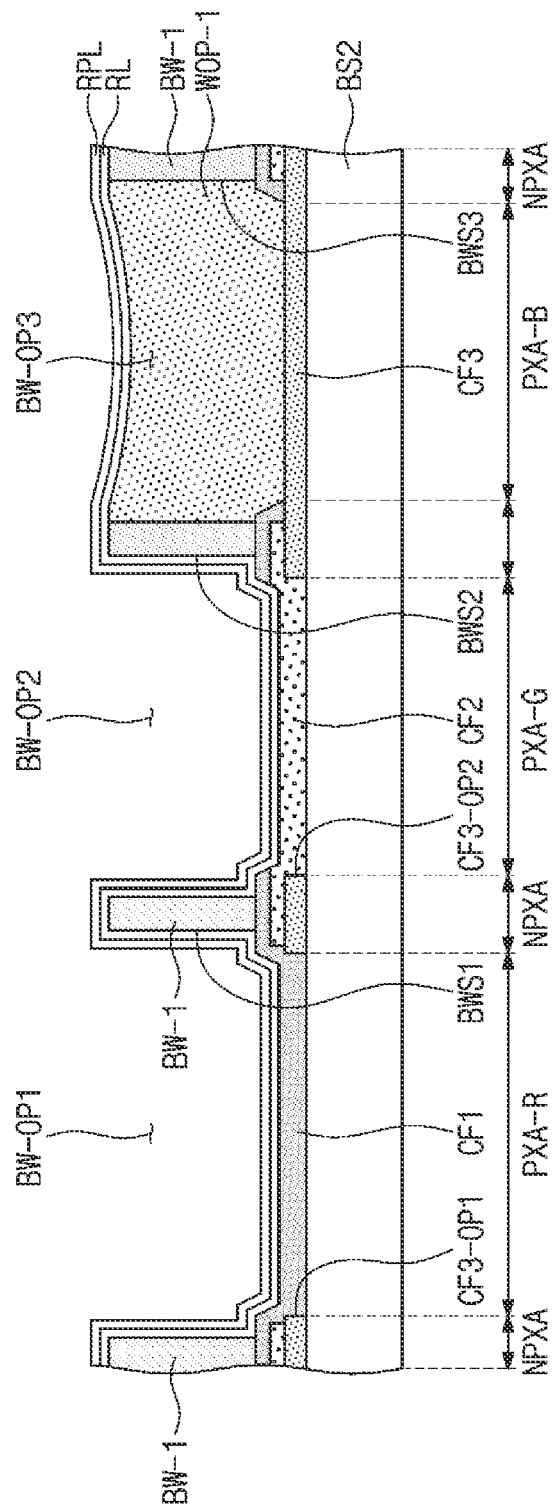

Referring to FIG. 7B, the inkjet head may include a nozzle N-W that provides a third composition WOP-L. A third composition WOP-L may be provided using an inkjet process. The third composition WOP-L may include a base resin and scattering particles.

Referring to 7B and 7C, a third composition WOP-L is dried. As a result, the third optical pattern WOP-1 may be formed.

Thereafter, a refractive layer RL covering the first color filter CF1, the second color filter CF2, the third optical pattern WOP-1, and the partition wall BW-1 is formed. After that, a protective layer RPL that covers the refractive layer RL and protects the refractive layer RL is formed.

The refractive layer RL may contact the first color filter CF1 in the first pixel area PXA-R and contact the second color filter CF2 in the second pixel area PXA-G, and may be spaced apart from the third color filter CF3 in the third pixel area PXA-B with the third optical pattern WOP-1 interposed therebetween.

Figure 7D:
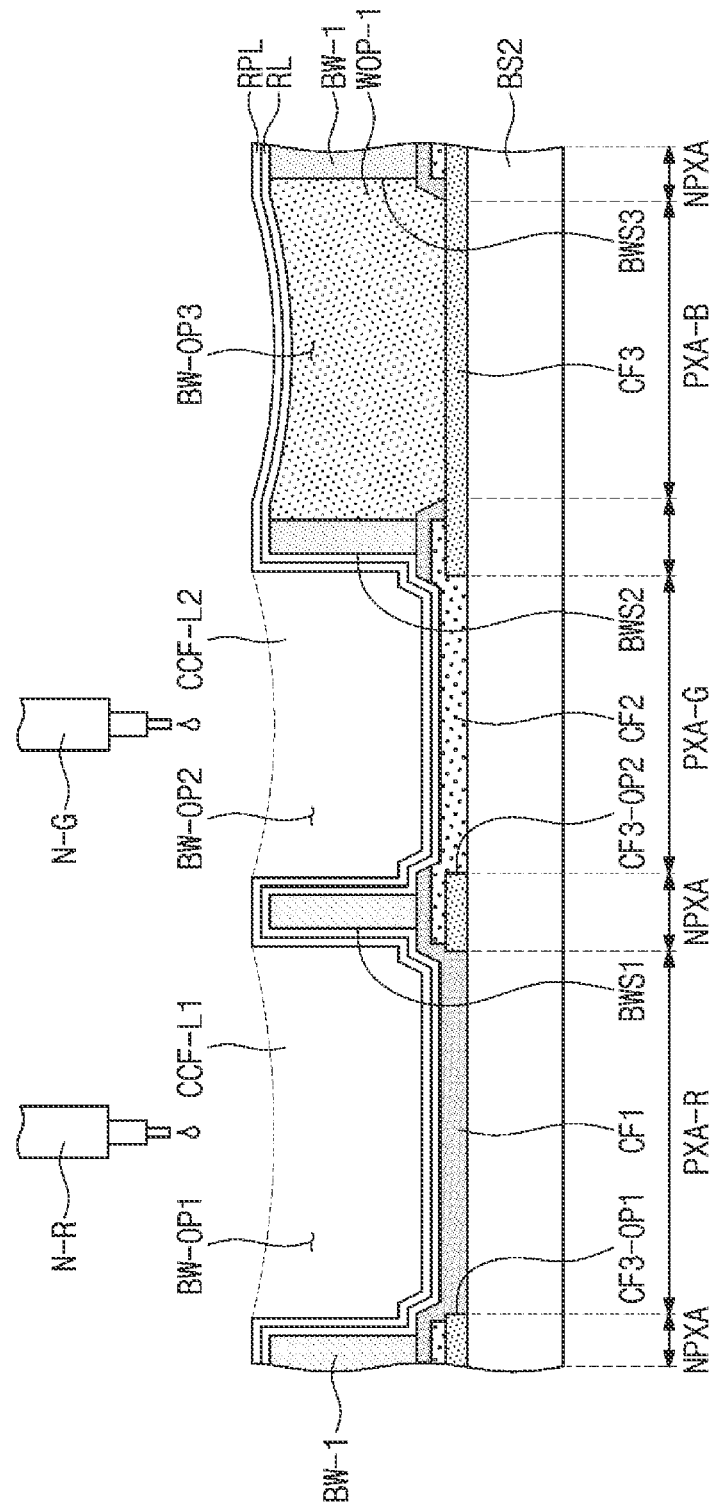

Referring to FIG. 7D, after forming a refractive layer RL and a protective layer RPL, a first composition CCF-L1 and a second composition CCF-L2 may be provided using an inkjet process. The inkjet head may include a nozzle N-R providing a first composition CCF-L1 and a nozzle N-G providing a second composition CCF-L2. While moving in a direction (e.g., a set or predetermined direction), the inkjet head may provide the first composition CCF-L1 to the first opening BW-OP1, and provide the second composition CCF-L2 to the second opening BW-OP2.

Figure 7E:
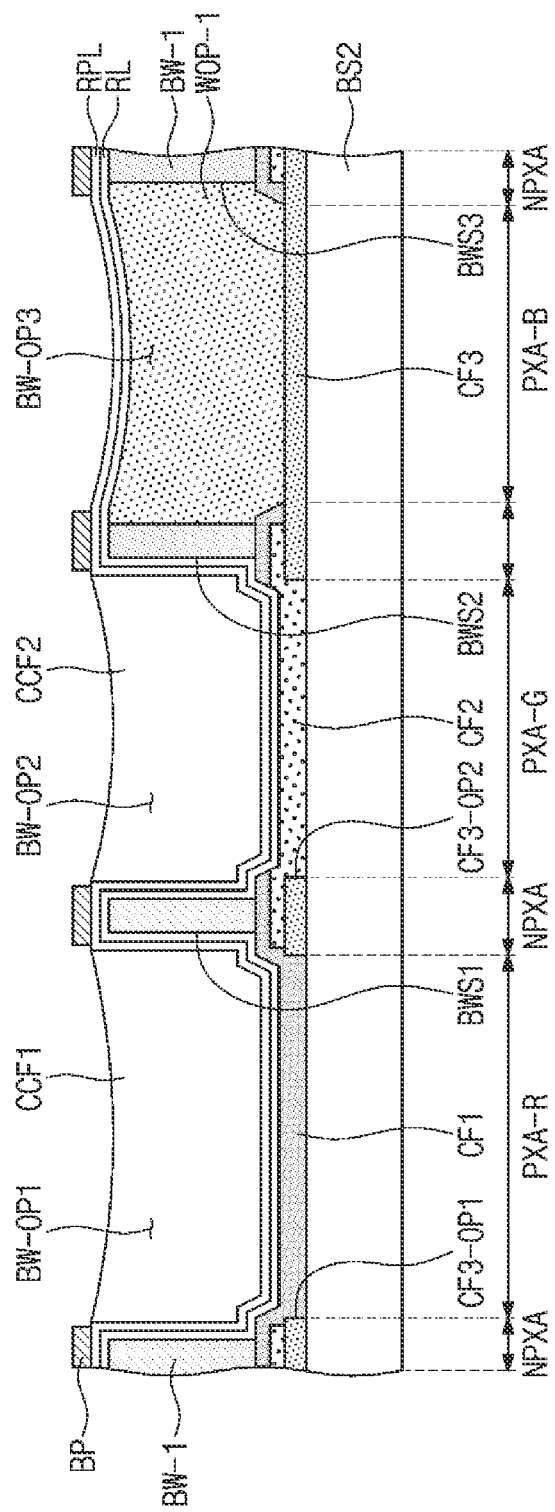

Referring to FIGS. 7D and 7E, the first composition CCF-L1 and the second composition CCF-L2 are dried. As a result, the first optical pattern CCF1 and the second optical pattern CCF2 are formed.

After that, as overlapping the peripheral area NPXA, a division pattern BP having an opening corresponding one-to-one to each of the first to third pixel areas PXA-R, PXA-G, and PXA-B may be formed.

As described above, the refractive layer may be located between the first optical pattern and the first sidewall of the partition wall, and between the second optical pattern and the second sidewall of the partition wall. The refractive layer refracts or reflects light directed to the partition wall, and accordingly, light emission efficiency (and therefore display quality) of the display panel may be improved.

In addition, the position of the refractive layer in the third pixel area where the third optical pattern is located may be different from the position of the refractive layer in the first and second pixel areas where the first and second optical patterns are located. Accordingly, while improving light emission efficiency, the display panel with relatively improved WAD characteristics may be provided.

Although aspects of some embodiments of the present invention have been described, it is understood that embodiments according to the present invention should not be limited to these embodiments but various changes and modifications can be made by one ordinary skilled in the art within the spirit and scope of the present invention as defined in the appended claims, and their equivalents.

What is claimed is:

1. A display panel including a first pixel area, a second pixel area, a third pixel area, and a peripheral area adjacent to the first, second, and third pixel areas, the display panel comprising:
   a first light emitting element, a second light emitting element, and a third light emitting element, the first, second, and third light emitting elements configured to generate source light and correspond to the first pixel area, the second pixel area, and the third pixel area, respectively;
   a first color filter, a second color filter, and a third color filter overlapping the first pixel area, the second pixel area, and the third pixel area, respectively;
   a first optical pattern between the first color filter and the first light emitting element configured to receive the source light and output a first color light different from the source light;
   a second optical pattern between the second color filter and the second light emitting element configured to receive the source light and output a second color light different from the source light;
   a third optical pattern between the third color filter and the third light emitting element configured to receive the source light and output a third color light substantially same as the source light; and
   a refractive layer between the first color filter and the first optical pattern, between the second color filter and the second optical pattern, and between the third optical pattern and the third light emitting element,
   wherein the refractive layer is a continuous layer from the first pixel area to the third pixel area.

2. The display panel of claim 1, further comprising a partition wall having a first opening corresponding to the first pixel area and a second opening corresponding to the second pixel area,
   wherein the first optical pattern is inside the first opening, wherein the second optical pattern is inside the second opening, and wherein the third optical pattern comprises a same material as the partition wall and conforms to a shape of the partition wall.

3. The display panel of claim 2, wherein the partition wall and the third optical pattern comprise a base resin and scattering particles mixed with the base resin.

4. The display panel of claim 2, wherein the refractive layer is between a first sidewall of the partition wall defining the first opening and the first optical pattern, and between a second sidewall of the partition wall defining the second opening and the second optical pattern.

5. The display panel of claim 2, wherein a first surface of the first optical pattern facing the first light emitting element and a second surface of the second optical pattern facing the second light emitting element have a curved shape, and wherein a third surface of the third optical pattern facing the third light emitting element has a flatter shape than the first surface and the second surface.

6. The display panel of claim 2, further comprising a division pattern in which a first pattern opening corresponding to the first pixel area, a second pattern opening corresponding to the second pixel area, and a third pattern opening corresponding to the third pixel area are defined, and wherein the division pattern is spaced apart from the partition wall with the refractive layer interposed therebetween, and the division pattern overlaps the peripheral area.

7. The display panel of claim 1, further comprising a partition wall in which a first opening corresponding to the first pixel area, a second opening corresponding to the second pixel area, and a third opening corresponding to the third pixel area are defined, and wherein the first optical pattern is inside the first opening, the second optical pattern is inside the second opening, and the third optical pattern is inside the third opening.

8. The display panel of claim 7, wherein the third optical pattern comprises a base resin and scattering particles mixed with the base resin, and wherein the partition wall comprises a light absorbing material.

9. The display panel of claim 7, wherein the refractive layer is between a first sidewall of the partition wall defining the first opening and the first optical pattern, and between a second sidewall of the partition wall defining the second opening and the second optical pattern, and wherein the third optical pattern is in direct contact with the partition wall.

10. The display panel of claim 7, further comprising a division pattern in which a first pattern opening corresponding to the first pixel area, a second pattern opening corresponding to the second pixel area, and a third pattern opening corresponding to the third pixel area are defined, and wherein the division pattern is spaced apart from the partition wall with the refractive layer interposed therebetween, and the division pattern overlaps the peripheral area.

11. The display panel of claim 1, wherein the first color filter is a red color filter, the second color filter is a green color filter, and the third color filter is a blue color filter, and wherein the source light is blue light, the first color light is red light, the second color light is green light, and the third color light is blue light.

12. The display panel of claim 1, wherein the third color filter overlaps the peripheral area and the third pixel area, the third color filter having openings defined to correspond to the first pixel area and the second pixel area, respectively, and wherein the first color filter overlaps the opening corresponding to the first pixel area, and the second color filter overlaps the opening corresponding to the second pixel area.

13. The display panel of claim 1, wherein a refractive index of the refractive layer is 1.23.

14. The display panel of claim 1, further comprising a protective layer covering and contacting the refractive layer.

15. An electronic device comprising a display panel including a first pixel area, a second pixel area, a third pixel area, and a peripheral area adjacent to the first, second, and third pixel areas, wherein the display panel further comprises:

a first light emitting element, a second light emitting element, and a third light emitting element, the first, second, and third light emitting elements being configured to generate source light and correspond to the first pixel area, the second pixel area, and the third pixel area, respectively;

a first color filter, a second color filter, and a third color filter overlapping the first pixel area, the second pixel area, and the third pixel area, respectively;

a partition wall having a first opening corresponding to the first pixel area and a second opening corresponding to the second pixel area, and overlapping the peripheral area;

a first optical pattern inside the first opening configured to receive the source light and to output a first color light different from the source light;

a second optical pattern inside the second opening configured to receive the source light and to output a second color light different from the source light; and a refractive layer overlapping the first, second, and third pixel areas and the peripheral area, wherein the refractive layer is between the first color filter and the first optical pattern, between a first sidewall of the partition wall defining the first opening and the first optical pattern, between the second color filter and the second optical pattern, and between a second sidewall of the partition wall defining the second opening and the second optical pattern, and wherein in an area overlapping the third pixel area, the refractive layer is spaced apart from the third color filter, wherein the refractive layer is a continuous layer from the first pixel area to the third pixel area, and wherein the third pixel area is configured to output light of a color substantially same as the source light.

16. The electronic device of claim 15, wherein the partition wall comprises a base resin and scattering particles, wherein the partition wall overlaps the third pixel area, and wherein in an area overlapping the third pixel area, a portion of the refractive layer is spaced apart from the third color filter with the partition wall interposed therebetween.

17. The electronic device of claim 15, wherein the display panel further comprises a third optical pattern between the third color filter and the third light emitting element configured to receive the source light and to output a third color light, wherein a third opening corresponding to the third pixel area is further defined in the partition wall, and wherein the third optical pattern is inside the third opening.

18. The electronic device of claim 17, wherein a portion of the refractive layer is spaced apart from the third color filter with the third optical pattern interposed therebetween.

19. The electronic device of claim 17, wherein the third optical pattern comprises a base resin and scattering particles mixed with the base resin, and wherein the partition wall comprises a light absorbing material.

20. A method of manufacturing a display panel including a first pixel area, a second pixel area, a third pixel area, and a peripheral area adjacent to the first, second, and third pixel areas, the method comprising:

forming a first color filter, a second color filter, and a third color filter overlapping the first pixel area, the second pixel area, and the third pixel area, respectively;

forming a partition wall having a first opening corresponding to the first pixel area and a second opening corresponding to the second pixel area, and overlapping the peripheral area and the third pixel area;

forming a refractive layer covering the first color filter, the second color filter, and the partition wall;

forming a first optical pattern inside the first opening after forming the refractive layer; and forming a second optical pattern inside the second opening after forming the refractive layer.

21. The method of claim 20, wherein the forming of the partition wall comprises a photolithography process, and wherein the partition wall is formed by patterning a layer including a base resin and scattering particles mixed with the base resin through the photolithography process.

22. The method of claim 20, further comprising:

forming a third opening in a portion of the partition wall overlapping the third pixel area; and forming a third optical pattern including a base resin and scattering particles mixed with the base resin inside the third opening, wherein after forming the third optical pattern, the refractive layer is formed before forming the first optical pattern and the second optical pattern.

* * * * *